United States Patent [19]

Ahmed

[11] 4,199,776
[45] Apr. 22, 1980

[54] INTEGRATED INJECTION LOGIC WITH FLOATING REINJECTORS

[75] Inventor: Adel A. A. Ahmed, Annandale, N.J.

[73] Assignee: RCA Corporation, New York, N.Y.

[21] Appl. No.: 936,409

[22] Filed: Aug. 24, 1978

[51] Int. Cl.² .................... H01L 27/04; H03K 19/08
[52] U.S. Cl. ............................. 357/46; 357/44; 357/92; 357/20
[58] Field of Search ..................... 357/46, 92, 44

[56] References Cited

U.S. PATENT DOCUMENTS

| Re. 28,928 | 8/1976 | Hart | 357/92 |
| 4,035,664 | 7/1977 | Berger et al. | 357/92 |
| 4,078,208 | 3/1978 | Hart et al. | 357/92 |
| 4,140,922 | 2/1979 | Mueller | 357/92 |
| 4,143,284 | 3/1979 | Mueller | 357/92 |
| 4,153,909 | 5/1979 | Dobkin | 357/92 |
| 4,158,783 | 6/1979 | Berger et al. | 357/92 |

FOREIGN PATENT DOCUMENTS 7511516  4/1976  Netherlands ................. 357/92

*Primary Examiner*—William D. Larkins
*Attorney, Agent, or Firm*—H. Christoffersen; D. S. Cohen; T. H. Magee

[57] ABSTRACT

An integrated injection logic (I²L) device includes at least two gate structures. Each gate structure includes a first region of one type conductivity with an injector region and a base region of the opposite type conductivity disposed therein adjacent a surface thereof. A second region of the opposite type conductivity is disposed in each gate structure adjacent the surface of the first region between the injector and base region. The second regions are electrically-floating regions free of any contact electrode.

4 Claims, 4 Drawing Figures

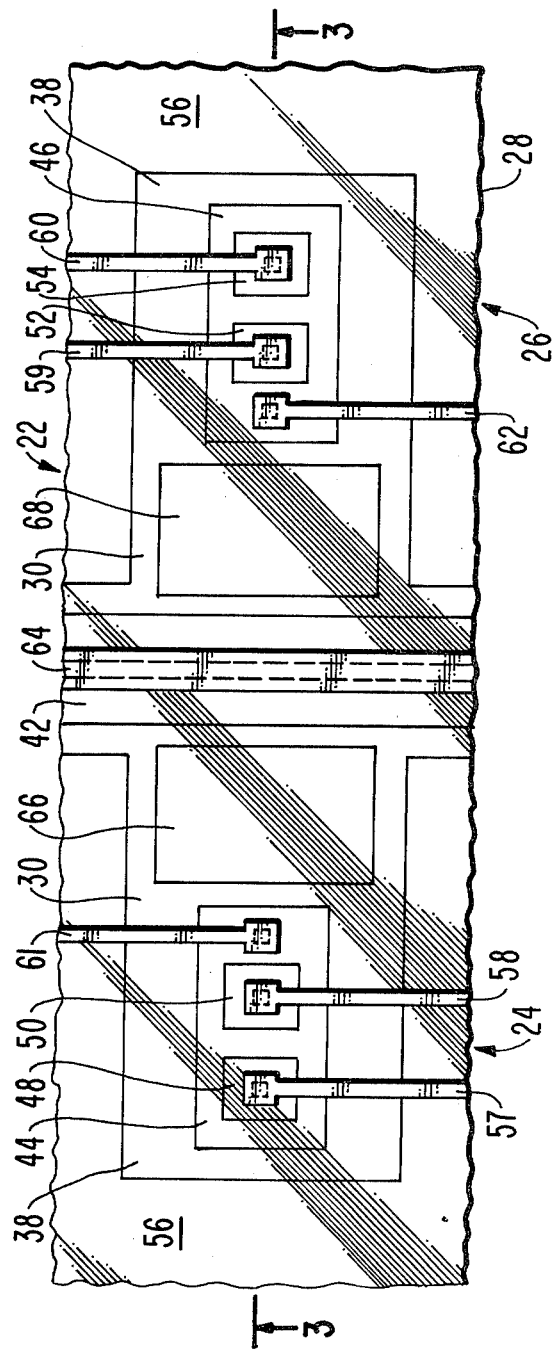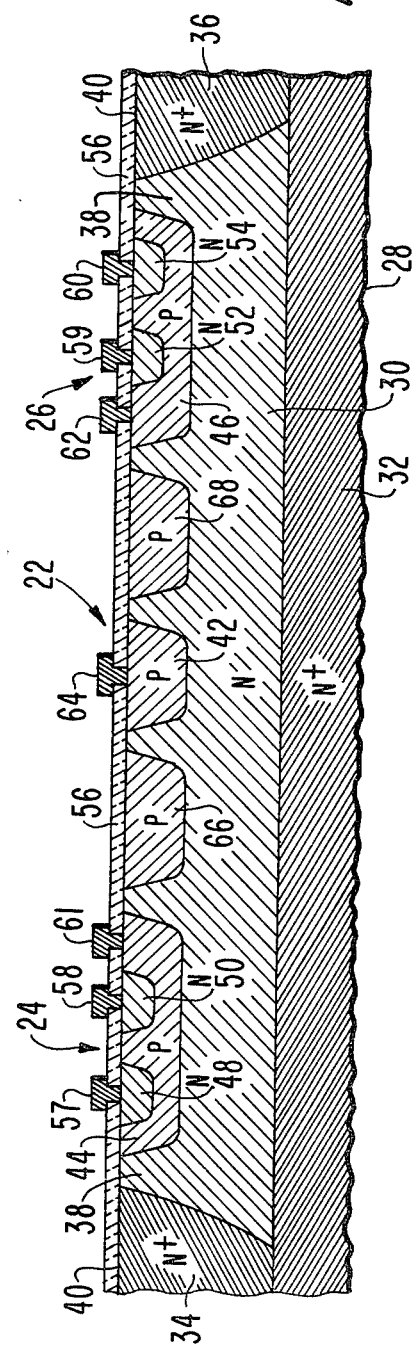
Fig. 2.
Fig. 3.

INTEGRATED INJECTION LOGIC WITH FLOATING REINJECTORS

This invention relates to an integrated injection logic (I²L) device having at least two gate structures wherein their injector regions are connected in parallel to a single input electrode.

I² L is a high-performance bipolar logic technology for LSI (large-scale integration) circuitry which provides a high-density capability having short switching times of the order of a nanosecond delay per gate and low microwatt power consumption. I² L enables designers to fabricate both digital and analog circuits on the same semiconductor chip. Injection logic reduces a gate to a single complementary transistor pair. For example, a vertical NPN transistor with multiple collectors operates as an inverter, a lateral PNP transistor serves both as current source and load, and no ohmic resistors are required for either the source or load function. When the I² L gate is laid out on a semiconductor chip, all circuit elements can be merged and fitted into the area of a single multi-emitter transistor, in the process eliminating completely the space-consuming necessity of device isolation.

One of the attractive points of I² L is the simplicity whereby a single input current $I_{IN}$ is supplied to a network of current injectors. Referring to the prior art circuit schematic of FIG. 1, there is illustrated an I²L circuit having two gate structures 10 and 12 including PNP transistors 14 and 16, respectively. The PNP transistors 14 and 16 have their emitters 14e and 16e connected to a common current source $I_{IN}$, typically a single injector rail. The PNP transistors 14 and 16 serve as the current source by "injecting" minority carriers, i.e., holes, into the emitter regions 18e and 20e of the NPN transistors 18 and 20, thus the phrase injection logic. A substantial number of these holes are collected by the base regions 18b and 20b of the NPN transistors 18 and 20. These currents forward-bias the emitter-base junctions of the NPN transistors 18 and 20 and thereby turn on the NPN transistors 18 and 20. Consequently, the base currents of the NPN transistors 18 and 20 are provided from the PNP transistors 14 and 16 acting as the current sources.

It is readily seen from FIG. 1 that the bases 18b and 20b of the NPN transistors 18 and 20 are common, respectively, to the collectors 14c and 16c of the PNP transistors 14 and 16, while the bases 14b and 16b of the PNP transistors 14 and 16 are common, respectively, to the emitters 18e and 20e of the NPN transistors 18 and 20. One may observe that the PNP transistors 14 and 16 operate with very little collector voltage when no signals are applied to logic input terminals $I_1$ and $I_2$, respectively. Such collector voltages as do exist are primarily due to differences in forwarded emitter-base drops. It should be noted, however, that the equivalent circuit of FIG. 1 is only a partially-correct representation, being analogous to the two-transistor representation of a silicon controlled rectifier. Since the collectors 14c and 16c of the PNP transistors 14 and 16 are in fact the bases 18b and 20b of the NPN transistors 18 and 20, carriers are injected directly into the NPN base regions 18b and 20b, and these currents may not be identical with the flow measured in the PNP collector regions 14c and 16c when wired to an external supply.

Referring to the prior art circuit schematic of FIG. 1, a practical difficulty arises when, for example, logic input terminal $I_2$ is at logic zero. The alpha (collector-to-emitter current gain) of PNP transistor 16 is then much greater than the alpha of PNP transistor 14, since there is a great disparity between the collector voltages; transistor 16 typically operates at about 600 millivolts while transistor 14 operates at less than 100 millivolts. Consequently, the bulk of the input current $I_{IN}$ is thereby diverted to transistor 16, and the base current drive to NPN transistor 18 is greatly diminished. This problem is compounded when more than two gate structures are connected to a common current source. The present invention provides a novel structure for correcting this particular current-hogging problem which occurs in high fan-out circuits.

In the drawings:

FIG. 2 is a plan view showing the preferred embodiment of the present novel integrated circuit device.

FIG. 3 is a cross-sectional view taken along line 3—3 of FIG. 2.

Figure 1:
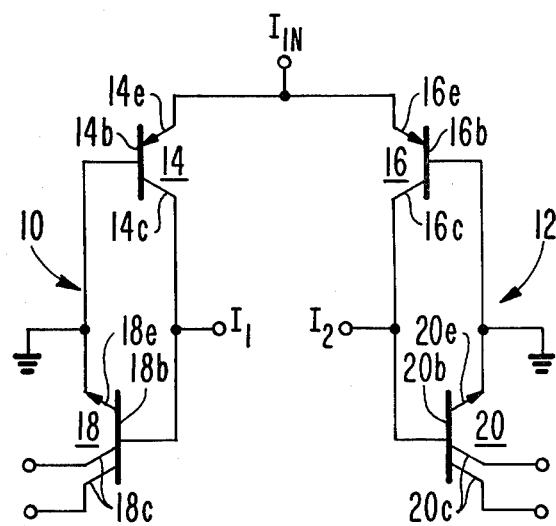
FIG. 1 is a prior art circuit diagram illustrating a basic I²L circuit having two gate structures connected to a common current source.

Referring to FIGS. 2 and 3 of the drawings, there is shown an I²L (integrated injection logic) device 22 having two gate structures 24 and 26 formed in a body 28 of semiconductor material, usually silicon. This semiconductor body 28 comprises an epitaxial layer 30 of one type conductivity, N type in the present example, disposed over a buried pocket 32 which contains the one-type conductivity modifiers to a relatively high degree. The I²L device typically includes heavily-doped N+ isolation regions 34 and 36 for increasing the current amplification factor of the NPN transistors and killing the parasitic effects of the PNP transistors between two adjacent gate structures (not shown).

Each of the gate structures 24 and 26 includes a first region 38 of the one-type conductivity disposed adjacent to a surface 40 of the body 28 and comprising a portion of the epitaxial layer 30. The I²L device 22 also includes an injector region 42 of the opposite type conductivity disposed in the body 28 adjacent to the surface 40. In the present embodiment, the two gate structures 24 and 26 share both the same first region 38 and the same injector region 42 which is illustrated in FIGS. 2 and 3 as a single injector rail common to both gate structures 24 and 26.

The gate structures 24 and 26 also include, respectively, base regions 44 and 46 of the opposite type conductivity disposed adjacent to the surface 40 and being apart from the injector region 42. Each of the base regions 44 and 46 have at least one collector region of the one-type conductivity disposed therein adjacent to the surface 40. In the present embodiment, the base region 44 has a pair of collector regions 48 and 50, and the base region 46 also has two collector regions 52 and 54. A protective layer 56 of insulating material is disposed on the surface 40 of the I²L device 22 and has appropriate openings therein through which collector electrodes 57, 58, 59, 60, base electrodes 61 and 62, and an injector electrode 64 contact, respectively, the collector regions 48, 50, 52, and 54, the base regions 44 and 46, and the injector region 42.

The present novel invention comprises providing each of the gate structures 24 and 26 with a second region of the opposite type conductivity, which is disposed in the first region 38 adjacent to the surface 40 between the injector region 42 and each of the base regions 44 and 46. These regions are electrically-floating regions free of any contact electrodes and, preferably, have widths greater than the width of the adjacent injector region 42. In the present embodiment, such second regions are shown in FIGS. 2 and 3 as regions 66 and 68 for gate structures 24 and 26, respectively. Preferably, the second regions 66 and 68 have a depth at least as great as the depth of the injector region 42 and the base regions 44 and 46, in order to achieve the desired current flow as further described below.

The present novel I²L device may be fabricated by utilizing conventionally known techniques. Preferably, the second regions 66 and 68 are diffused simultaneously with the base regions 44 and 46 while utilizing the same doping mask. For further information on fabricating a standard I²L device, see Horton et al., "I²L Takes Bipolar Integration A Significant Step Forward", *Electronics,* Feb. 6, 1975, Volume 48, pages 83 through 90.

Figure 4:
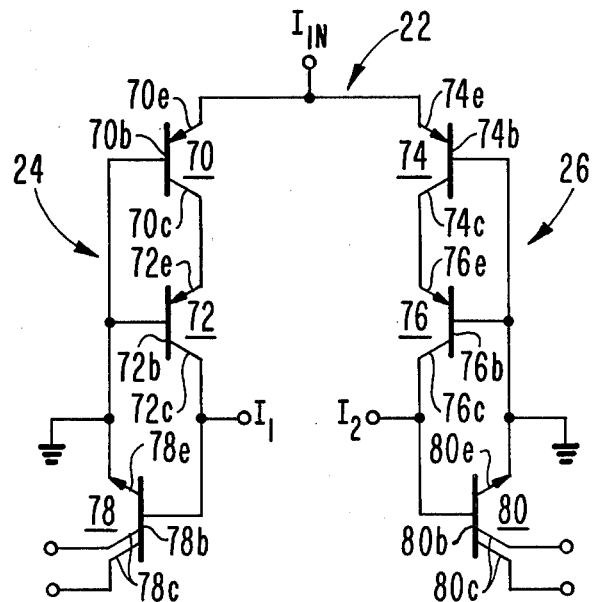
FIG. 4 is a circuit diagram for the integrated circuit device of FIGS. 2 and 3.

Referring to FIG. 4, there is shown an analogous circuit diagram which is the equivalent circuit representation for the I²L device of FIGS. 2 and 3. In operation, second region 66 functions simultaneously as the collector and emitter regions 70c and 72e of PNP transistors 70 and 72, respectively, while second region 68 functions simultaneously as the collector and emitter regions 74c and 76e of PNP transistors 74 and 76, respectively. The N type base regions 70b and 72b of PNP transistors 70 and 72 are common to the emitter region 78e of NPN transistor 78, while the N type base regions 74b and 76b of PNP transistors 74 and 76 are common to the emitter region 80e of NPN transistor 80. The P type region 44 serves as both the base region 78b and the collector region 72c, while the P type region 46 serves as both the base region 80b and the collector region 76c. The collector regions 48 and 50 serve as the collectors 78c of transistor 78, while the collector regions 52 and 54 serve as the collectors 80c of transistor 80. As described above, the width of the injector region 42 is preferably less than the width of the second regions 66 and 68, as shown in FIG. 3. In fact, it is desirable that the width of the injector region 42 be made as small as possible compared to the width of the second regions 66 and 68 which should be made as large as feasible. The resulting difference in junction-area causes the forward emitter-base voltage drop of transistor 72 to be smaller than that of transistor 70, thereby making possible a cascading-type operating arrangement. Such difference in emitter-base voltage drop could also be achieved by varying the respective doping concentrations. Likewise, under similar operating conditions, the forward emitter-base voltage drop of transistor 76 will be smaller than that of transistor 74. Integrated transistors utilized in such a tandem-type manner may be said to be in cascode operation, being somewhat analogous to the operation of a cascode amplifier.

This cascode-like arrangement is used for minimizing the current-hogging problem associated with multi-gate structures having a common injector rail. For example, when logic input terminal $I_2$ of FIG. 4 is at ground potential, although transistor 76 then operates at a relatively large collector voltage, transistors 70 and 74 now operate at comparable collector voltages and there is no preferential current path through transistor 74 as compared with transistor 70. Consequently, the bulk of the input current $I_{IN}$ is not diverted to transistor 74, and the base current drive to transistor 72 is not significantly diminished. The present novel structure is particularly desirable for correcting the current-hogging problem when more than two gate structures are connected to a common current source.

What is claimed is:

1. In an integrated injection logic (I²L) device having at least two gate structures formed in a body of semiconductor material, each of said gate structures including a first region of one type conductivity disposed adjacent to a surface of said body and having an injector region and a base region of the opposite type conductivity disposed therein adjacent to said surface, said base region being apart from said injector region and having at least one collector region of the one type conductivity disposed therein adjacent to said surface, wherein the injector regions of said gate structures are connected in parallel to a single input electrode, the improvement in said device comprising:

each of said gate structures having a second region of the opposite type conductivity disposed in said first region adjacent to said surface between said injector and said base regions, said second region being an electrically-floating region free of any contact electrode and having a width greater than the width of the injector region.

2. An integrated injection logic device as defined in claim 1 wherein said injector regions are juxtaposed to comprise a single injector rail.

3. An integrated injection logic device as defined in claim 2 wherein in each of said gate structures said second region has a depth at least as great as the depth of said injector rail and said base regions.

4. An integrated injection logic device as defined in claim 3 wherein said one type conductivity is N type and said opposite type conductivity is P type.

* * * * *